United States Patent [19]
Ozimek et al.

[11] Patent Number: 5,382,310
[45] Date of Patent: Jan. 17, 1995

[54] PACKAGING MEDICAL IMAGE SENSORS

[75] Inventors: Edward J. Ozimek, Penfield; Terry Tarn, Pittsford, both of N.Y.

[73] Assignee: Eastman Kodak Company, Rochester, N.Y.

[21] Appl. No.: 236,782

[22] Filed: Apr. 29, 1994

[51] Int. Cl.⁶ .............................. B32B 31/00
[52] U.S. Cl. ..................... 156/275.5; 156/275.7; 156/299; 156/84; 264/22; 264/272.13
[58] Field of Search ............. 156/275.5, 275.7, 84, 156/299; 264/272.13, 22, 272.16, 272.17, 272.18

[56] References Cited

U.S. PATENT DOCUMENTS

| | | | |
|---|---|---|---|
| 3,811,983 | 5/1974 | Rowland | 156/84 |
| 4,822,536 | 4/1989 | Voinis | 264/22 |
| 4,849,048 | 7/1989 | Inagaki et al. | 156/275.5 |
| 5,061,336 | 10/1991 | Soane | 156/275.7 |
| 5,098,630 | 3/1992 | Ogiu et al. | 264/272.1 |
| 5,110,513 | 5/1992 | Puvilland | 264/22 |
| 5,114,632 | 5/1992 | Soane | 264/22 |

Primary Examiner—Chester T. Barry
Attorney, Agent, or Firm—Raymond L. Owens

[57] ABSTRACT

A method of producing a package for an image sensor using several applications of adhesive and a glass cover plate is set forth.

2 Claims, 2 Drawing Sheets

PACKAGING MEDICAL IMAGE SENSORS

FIELD OF THE INVENTION

The present invention relates to forming packages for an image sensor used for medical applications.

BACKGROUND OF THE INVENTION

Small conventional solid-state image sensors are mounted on an insertion probe and are used in medical applications. A problem with such arrangements is that frequently the image sensor is formed in a ceramic package body and then the ceramic package body is secured to a lead frame by an adhesive. (See for example, U.S. Pat. No. 5,098,630 issued Mar. 24, 1992 to Ogiu et al.)

It is very difficult to package image sensors for use in medical applications by conventional means and obtain a small, minimally invasive size needed for best performance. The sidewalls of the traditional ceramic package body often add to the overall dimension of the final product.

SUMMARY OF THE INVENTION

It is an object of the present invention to provide an improved method for packaging image sensors which are suitable for use in medical applications.

This object is achieved in a method of packaging a medical image sensor, comprising:
 (a) securing a die (image sensor) to a top surface of a conductive lead frame having top and bottom surfaces;
 (b) providing electrical connections between the lead frame and the die;
 (c) forming an optical transparent UV curable adhesive over the die and curing such adhesive so that the top surface of the adhesive over the die has a concave topography;
 (d) filling in the concave topography with UV curable adhesive;
 (e) placing a cover glass over the filled in adhesive, such cover glass having an index of refraction matched to the filled in adhesive; and
 (f) exposing the filled in adhesive with UV light illuminated through the glass cover to such cured filled in adhesive and thereby secure the glass to the filled in adhesive.

Advantages

An advantage of this invention is that the assemblage of lead frames, die and electrical connections (typically, wire bonds), UV curable adhesives, and a cover glass produce a package having good structural properties.

Another feature of this invention is that the cover glass, which is indexed matched to the adhesive provides an optically sound top protective surface. The cured adhesive provides a good moisture barrier, good sidewall strength, protection for the delicate components, and a good optical path for image detection purposes.

This type of package provides the smallest possible diameter available to adequately house the image sensor. The integrity of the package is excellent. A high quality optical adhesive provides good support and adhesion to the cover glass as well as an excellent optical path. This package is suitable for medical imaging requirements because it provides a minimally invasive size. The cost of making the assembly will be reduced, and this technique can be applied on a mass production scale. This type of encapsulation will be superior in its optical quality as compared to a plastic, molded package.

Other features of this invention include (1) providing a packaging arrangement for the basic components of an image sensor assembly which doesn't have to use a carrier for housing the parts, (2) being able to create a protective surrounding medium with excellent optical properties by using the proper adhesive, (3) building the encapsulating volume by using more than one application of the optical adhesive to the cavity thus compensating for gross volumetric shrinkage, and (4) centering and attaching of the cover plate by free floating the cover glass on the uppermost layer of adhesive.

DETAILED DESCRIPTION OF THE PREFERRED EMBODIMENT

Figure 1:
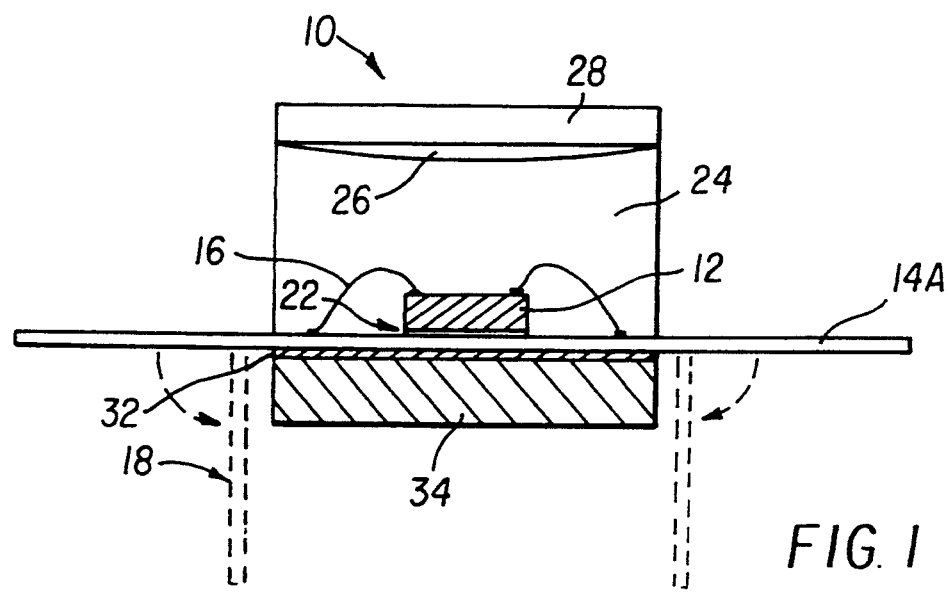
FIG. 1 is a schematic sectional view of a package formed in accordance with the present invention.
Figure 2:
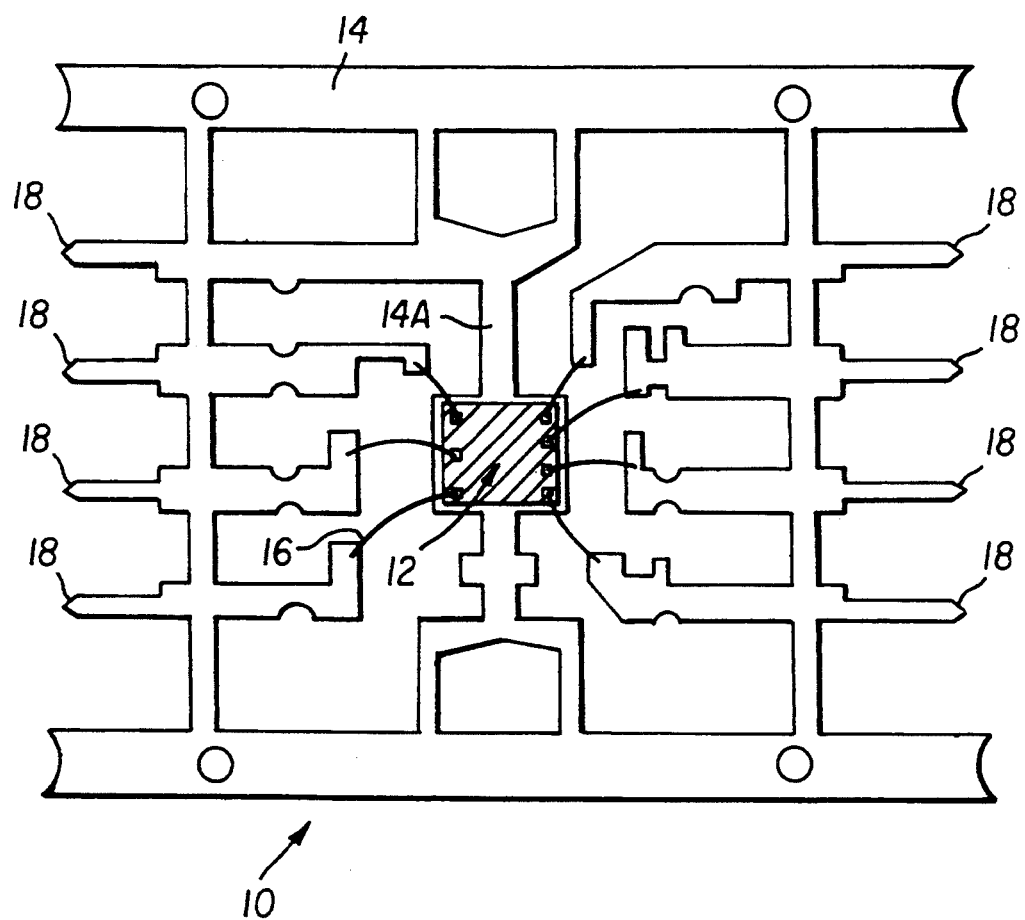
FIG. 2 is a top plan view of a lead frame with a die mounted on the lead frame and associated wirebond connections.

Turning now to FIGS. 1 and 2, there is shown a package 10 for an image sensor or die 12, a lead frame 14 having top and bottom surfaces, and wirebonds 16 electrically connecting the die to the conductive portions of the lead frame 14. Turning now to FIG. 2, the lead frame is shown in the form a of a skeletal structure having a portion 14A upon which is mounted the image sensor as will be described. The wirebonds are shown connected to conductive portions which terminate into electrical pins 18. As is well known to those skilled in the art, the lead frame is a stamped metal skeletal structure that provides support for the die and provides the electrical pins 18. Lead frames are typically made of an alloy, generally nickel and iron and are well understood to those skilled in the art. Typically, (although not shown) the lead frame will include a gold plated portion over those areas which are connected to the electrical pins 18. The electrical pins 18 are often referred to as pinouts.

Returning to FIG. 1, the die 12 is attached to the lead frame portion 14A with an electrically conductive adhesive 22. The lead frame 14 and die 12 form the basic components of a structure used in a conventional microelectronic package.

The adhesive 22 is typically a silver filled epoxy. An example of such an adhesive is Epotek 410-E made by Epoxy Technology Inc., Billerica, Mass. The purpose of adhesive 22 is to secure the die 12 to the lead frame portion 14A and to provide electrical conduction to the lead frame itself. As will be well understood to those skilled in the art, the lead frame 14 itself, provides a ground plane with the portion 14A providing the mounting structure for the die.

Returning again to FIG. 1, there is shown that the top surface of the die 12 is adhesive free. Onto this surface is cast a UV curable adhesive 24. Examples of such an adhesive 24 are Dymax 401 and 488 manufactured by the Dymax Corp. of Torrington, Conn. Both of these materials are urethane, oligomer, and (meth)acrylic monomer blends. The optical properties of these materials are such that they have an index of refraction of approximately 1.5. This adhesive 24 is cured by UV or ultraviolet radiation using about a watt/cm$^2$ with peak spectral response at 365 nm. A system which can readily provide such UV radiation is EFOS (ultracure 100 SS machine) using a 100 watt short arc mercury amp. As shown, because of the shrinkage, upon curing of these types of materials, the cured adhesive 24 has a concave top surface topography.

Within the confines of this concave topography another adhesive 26 is dispensed. Preferably this material is the same as adhesive 24 although it can be formed from other adhesive which are compatible especially having almost the same refractive index.

A glass cover 28 is now place over the filled in adhesive 26. The glass cover 28 is actually in a free floating relationship on the adhesive 26 and stays in such a relationship until it is cured. This cover has an index of refraction matched to both the adhesives 24 and 26. In a preferred embodiment, both the adhesives 24 and 26 are made of the same material, although that is not necessary. In a situation where they are the same material, then glass cover 28 should have the same index of refraction as that of both adhesives. A typical cover glass 28 that can be used is Corning #7059 which is made of a barria alumina borosilicate which has an index of refraction of about 1.5. This material is transparent to both visual and ultraviolet radiation. Although not shown, antireflective coatings may be secured to both the top and bottom surfaces of the cover glass 28.

UV radiation now exposes the filled in adhesive 26 through the glass cover 28 to cure the filled in adhesive 26 and secure the glass cover 28 to the structure.

The glass cover provides a uniform optical quality top flat surface and provides a good optical interface with the external environment such air, or an optical system provided by lens or fiber optics.

Figure 3:
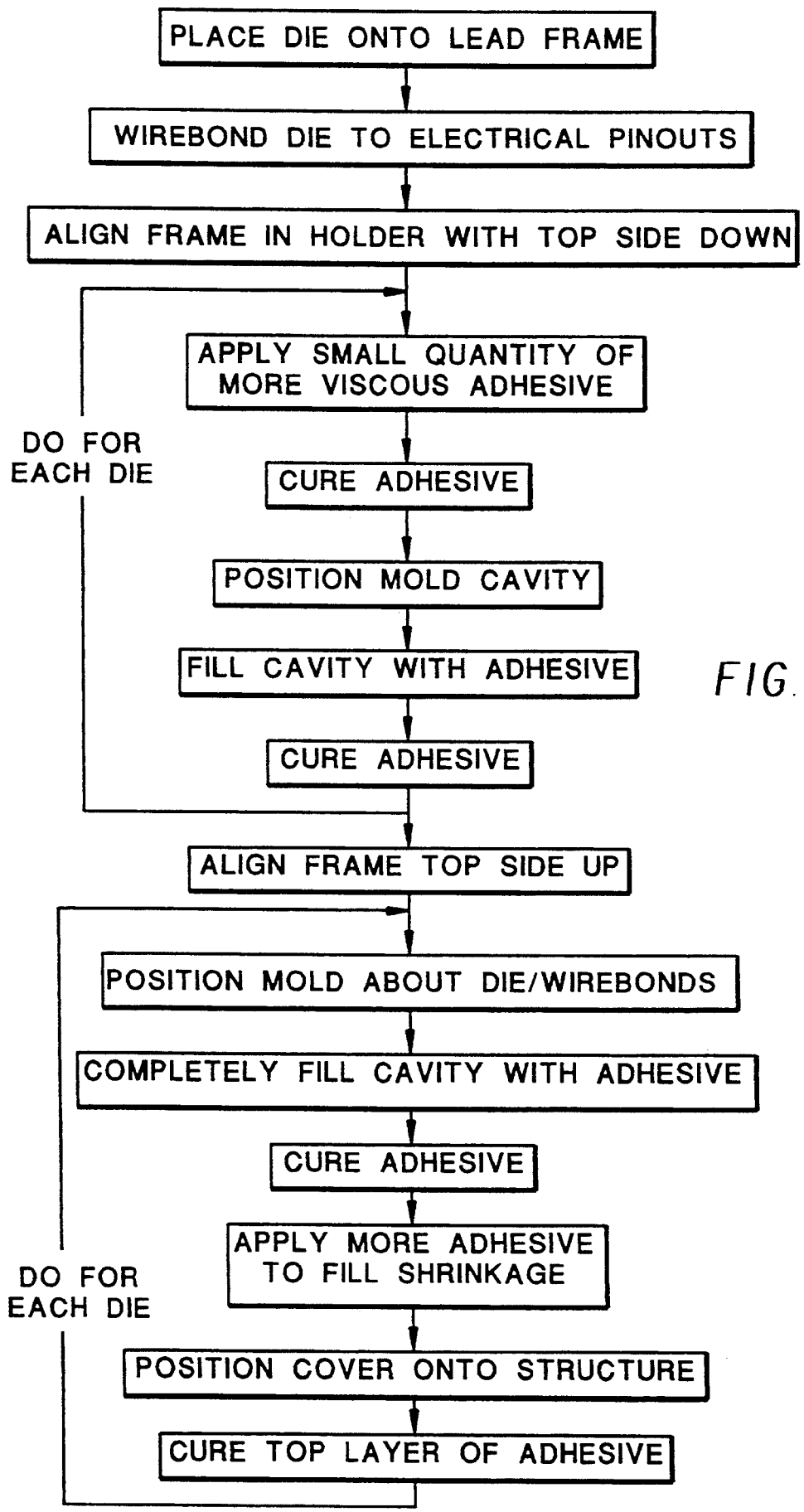
FIG. 3 is a flow chart of the process of making the package shown in FIG. 1.

Turning now to FIG. 3 it shows a flowchart for packaging an image sensor in accordance with this invention. The die (image sensor) 12 is attached to the central portion of the lead frame 14A using a conductive adhesive such as Epotek 410-E. The lead frame 14 is made from nickel or iron and is gold plated on both sides of the electrical pins 18 and on the top side where the die 12 is attached and electrically connected. Once the die 12 is placed and the epoxy is cured, wirebonds 16 are secured between the die and pins or pinouts 18.

At this point, the packaging process begins with the lead frame 14 being placed in a holder top side down. The holder is not shown. A small quantity of a viscous adhesive 32, such as Norland 123, is applied to the underside of the lead frame 14 beneath the die/wirebond area and is cured quickly by exposure to ultra-violet radiation. This helps prevent leaking of the less viscous adhesive. These adhesives are viscous optical adhesives that can be quickly cured by ultraviolet exposure. A mold (not shown) is positioned over the underside and an adhesive 34 such as Norland 83H (Norland Products, Inc., New Brunswick, N.J.) or Dymax 401 or 488 is dispensed. The sidewalls of the mold are made from a material, such as Teflon, which resist adhesion by the epoxy. Once filled, the volume is exposed to UV radiation and cured. The sidewalls are removed from the adhesive and the process continues with the next part until all of the parts on the lead frame 14 are completed on the underside.

The lead frame 14 is then aligned in the fixture with the top side up. A mold of similar material and shape as described previously is positioned about the die and wirebonds. The cavity formed by the sidewalls is completely filled with an optical grade adhesive 24 such as those made by Norland (83H) and Dymax 401 or 488 which are index matched to the cover glass 28. Ultraviolet radiation is used to cure the adhesive. Due the volumetric shrinkage of such adhesives upon curing, an additional application of adhesive is placed in the small recess remaining after the first exposure. Once placed, the cover glass 28 (which can be any transparent material such as quartz, silica or glass) is positioned above the structure and centered. A barium borosilicate glass, Corning 7059, can, as noted above, be used over the image sensors. The UV radiation is again applied to the adhesive through the glass which results in a package of a minimal size, sealed against moisture, and having a good optical path.

This process is applied to all of the die 12 on the lead frame 14. Once completed, the individual parts can be separated from the frame and used individually.

The invention has been described in detail with particular reference to certain preferred embodiments thereof, but it will be understood that variations and modifications can be effected within the spirit and scope of the invention.

PARTS LIST 10 image sensor
12 die
14 lead frame
14A sidewalls
16 wirebonds
18 electrical pins
18 pinouts
22 adhesive
24 UV curable adhesive
26 adhesive
28 glass cover
32 viscous adhesive
34 UV curable adhesive

We claim:

1. A method of packaging a medical image sensor, comprising:
   (a) securing a die (image sensor) to top surface of a conductive lead frame having top and bottom surfaces;
   (b) providing electrical connections between the lead frame and the die;
   (c) forming an optical transparent UV curable adhesive over the die and curing such adhesive so that the top surface of the adhesive over the die has a concave topography;
   (d) filling in the concave topography with UV curable adhesive;
   (e) placing a cover glass 28 over the filled in adhesive, such cover glass 28 having an index of refraction matched to the filled in adhesive,; and
   (f) exposing the filled in adhesive with UV light illuminated through the glass cover to such cured filled in adhesive and thereby securing the glass cover to the filled in adhesive.

2. The invention as set forth in claim 1 wherein the lead frame is a skeletal structure and the electrical connections are wirebonds connecting portions of the lead frame skeletal structure to the die.

* * * * *